(12) United States Patent
Arbore et al.

(10) Patent No.: US 11,552,454 B1
(45) Date of Patent: Jan. 10, 2023

(54) INTEGRATED LASER SOURCE

(71) Applicant: Apple Inc., Cupertino, CA (US)

(72) Inventors: Mark Alan Arbore, Los Altos, CA (US); Gary Shambat, San Francisco, CA (US); Miikka M. Kangas, Sunnyvale, CA (US); Ross M. Audet, Menlo Park, CA (US); Jeffrey G. Koller, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/142,676

(22) Filed: Sep. 26, 2018

Related U.S. Application Data

(60) Provisional application No. 62/564,554, filed on Sep. 28, 2017.

(51) Int. Cl.
*H01S 5/024* (2006.01)
*H01S 5/40* (2006.01)
(Continued)

(52) U.S. Cl.
CPC .............. *H01S 5/4087* (2013.01); *G01J 3/10* (2013.01); *H01S 5/021* (2013.01); *H01S 5/0206* (2013.01);
(Continued)

(58) Field of Classification Search
None
See application file for complete search history.

(56) References Cited

U.S. PATENT DOCUMENTS 4,227,091 A 10/1980 Sick
4,880,304 A 11/1989 Jaeb
(Continued)

FOREIGN PATENT DOCUMENTS

| CN | 1957508 A | * 5/2007 | ................ G01J 3/10 |
| EP | 1753104 | 2/2007 | |

(Continued)

OTHER PUBLICATIONS

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.
(Continued)

*Primary Examiner* — Tod T Van Roy
(74) *Attorney, Agent, or Firm* — Brownstein Hyatt Farber Schreck, LLP

(57) ABSTRACT

Integrated laser sources emitting multi-wavelengths of light with reduced thermal transients and crosstalk and methods for operating thereof are disclosed. The integrated laser sources can include one or more heaters and a temperature control system to maintain a total thermal load of the gain segment, the heater(s), or both of a given laser to be within a range based on a predetermined target value. The system can include electrical circuitry configured to distribute current to the gain segment, the heater(s), or both. The heater(s) can be located proximate to the gain segment, and the distribution of current can be based on the relative locations. In some examples, the central laser can be heated prior to being activated. In some examples, one or more of the plurality of lasers can operate in a subthreshold operation mode when the laser is not lasing to minimize thermal perturbations to proximate lasers.

18 Claims, 9 Drawing Sheets

(51) Int. Cl.
*G01J 3/10* (2006.01)
*H01S 5/02* (2006.01)
*H01S 5/125* (2006.01)
*H01S 5/068* (2006.01)
*H01S 5/026* (2006.01)
*H01S 5/0625* (2006.01)
*H01S 5/02325* (2021.01)

(52) U.S. Cl.
CPC ........ *H01S 5/0261* (2013.01); *H01S 5/02325* (2021.01); *H01S 5/02453* (2013.01); *H01S 5/06256* (2013.01); *H01S 5/06804* (2013.01); *H01S 5/125* (2013.01)

(56) References Cited

U.S. PATENT DOCUMENTS

| | | | | |
|---|---|---|---|---|
| 4,896,325 | A | 1/1990 | Coldren | |
| 5,140,605 | A * | 8/1992 | Paoli | H01S 5/068 372/50.1 |
| 5,287,376 | A | 2/1994 | Paoli | |
| 5,325,392 | A | 6/1994 | Tohmori | |
| 5,341,391 | A | 8/1994 | Ishimura | |
| 5,483,261 | A | 1/1996 | Yasutake | |
| 5,488,204 | A | 1/1996 | Mead et al. | |
| 5,515,391 | A * | 5/1996 | Endriz | H01S 5/02415 372/50.1 |
| 5,695,520 | A | 12/1997 | Bruckner et al. | |
| 5,708,674 | A | 1/1998 | Berrnink | |
| 5,742,631 | A | 4/1998 | Paoli | |
| 5,780,875 | A | 7/1998 | Tsuji | |
| 5,825,352 | A | 10/1998 | Bisset et al. | |
| 5,835,079 | A | 11/1998 | Shieh | |
| 5,850,411 | A | 12/1998 | Major, Jr. | |
| 5,880,411 | A | 3/1999 | Gillespie et al. | |
| 5,915,165 | A | 6/1999 | Sun | |
| 6,188,391 | B1 | 2/2001 | Seely et al. | |
| 6,263,222 | B1 | 7/2001 | Diab | |
| 6,310,610 | B1 | 10/2001 | Beaton et al. | |
| 6,323,846 | B1 | 11/2001 | Westerman et al. | |
| 6,341,116 | B1 | 1/2002 | Lee | |
| 6,345,135 | B1 | 2/2002 | Reid | |
| 6,475,153 | B1 | 11/2002 | Khair et al. | |
| 6,516,017 | B1 * | 2/2003 | Matsumoto | H01S 5/0265 372/20 |
| 6,558,335 | B1 | 5/2003 | Thede | |
| 6,605,045 | B2 | 8/2003 | Ohsaki et al. | |
| 6,628,686 | B1 | 9/2003 | Sargent | |
| 6,647,032 | B1 | 11/2003 | Lee et al. | |
| 6,690,387 | B2 | 2/2004 | Zimmerman et al. | |
| 6,690,693 | B1 | 2/2004 | Crowder | |
| 6,699,199 | B2 | 3/2004 | Asada et al. | |
| 6,788,719 | B2 | 9/2004 | Crowder | |
| 6,795,453 | B2 * | 9/2004 | Pezeshki | H01S 5/4031 372/38.07 |
| 6,803,604 | B2 | 10/2004 | Takahashi et al. | |
| 6,816,529 | B2 * | 11/2004 | Vail | H01S 5/4025 372/50.1 |
| 6,915,955 | B2 | 7/2005 | Jung | |
| 6,990,129 | B2 | 1/2006 | Buimovich et al. | |
| 7,015,894 | B2 | 3/2006 | Morohoshi | |
| 7,106,778 | B2 | 9/2006 | Reid | |
| 7,130,325 | B2 | 10/2006 | Oh et al. | |
| 7,184,064 | B2 | 2/2007 | Zimmerman et al. | |
| 7,189,011 | B2 | 3/2007 | Harker | |
| 7,283,242 | B2 | 10/2007 | Thornton | |
| 7,469,092 | B2 | 12/2008 | Sappey et al. | |
| 7,483,453 | B2 | 1/2009 | Diffily et al. | |
| 7,526,007 | B2 | 4/2009 | Chua et al. | |
| 7,558,301 | B2 | 7/2009 | Lin et al. | |
| 7,616,110 | B2 | 11/2009 | Crump et al. | |
| 7,620,078 | B2 | 11/2009 | Mori | |
| 7,663,607 | B2 | 2/2010 | Hotelling et al. | |
| 7,664,156 | B2 | 2/2010 | Yamazaki | |
| 7,738,935 | B1 | 6/2010 | Turcott | |
| 7,751,658 | B2 | 7/2010 | Welch et al. | |
| 7,885,302 | B2 | 2/2011 | Eberhard | |
| 7,903,704 | B2 | 3/2011 | Patel et al. | |
| 8,000,368 | B2 * | 8/2011 | Pezeshki | H01S 5/042 372/38.03 |
| 8,121,169 | B2 | 2/2012 | Nguyen et al. | |
| 8,222,084 | B2 | 7/2012 | Dallesasse et al. | |
| 8,259,770 | B2 * | 9/2012 | Tagansky | B41J 2/45 372/50.122 |
| 8,279,441 | B2 | 10/2012 | Brown | |
| 8,320,763 | B2 | 11/2012 | Kim et al. | |
| 8,352,008 | B2 | 1/2013 | Kuhn et al. | |
| 8,378,811 | B2 | 2/2013 | Crump et al. | |
| 8,437,825 | B2 | 5/2013 | Dalvi et al. | |
| 8,442,608 | B2 | 5/2013 | Pav | |
| 8,457,172 | B2 | 6/2013 | Reid et al. | |
| 8,479,122 | B2 | 7/2013 | Hotelling et al. | |
| 8,588,266 | B2 | 11/2013 | Fujii | |
| 8,618,930 | B2 | 12/2013 | Papadopoulos et al. | |
| 8,649,839 | B2 | 2/2014 | Chin | |
| 8,750,341 | B2 * | 6/2014 | Bazzani | H04N 9/3129 372/38.02 |
| 8,774,243 | B2 | 7/2014 | Kim et al. | |
| 8,781,548 | B2 | 7/2014 | Besko et al. | |
| 8,886,465 | B2 | 11/2014 | Cinbis et al. | |
| 8,954,135 | B2 | 2/2015 | Yuen et al. | |
| 8,964,806 | B2 | 2/2015 | Ensher et al. | |
| 8,995,483 | B2 | 3/2015 | Diehl et al. | |
| 9,065,251 | B2 | 6/2015 | Fukuda et al. | |
| 9,093,813 | B2 | 7/2015 | Pushkarsky et al. | |
| 9,172,211 | B2 | 10/2015 | Kuksenkov et al. | |
| 9,209,602 | B2 | 12/2015 | Davies et al. | |
| 9,425,365 | B2 | 8/2016 | Kurtin | |
| 9,526,421 | B2 | 12/2016 | Papadopoulos et al. | |
| 9,526,431 | B2 | 12/2016 | Zakharov et al. | |
| 9,529,160 | B2 | 12/2016 | Orcutt et al. | |
| 9,543,736 | B1 | 1/2017 | Barwicz et al. | |
| 9,595,804 | B2 | 3/2017 | Minneman et al. | |
| 9,759,652 | B2 | 9/2017 | Yu | |
| 9,780,266 | B2 | 10/2017 | Lotito et al. | |
| 9,804,027 | B2 | 10/2017 | Fish | |
| 9,882,073 | B2 | 1/2018 | Krasulick et al. | |
| 9,883,824 | B2 | 2/2018 | Tiao | |
| 9,888,838 | B2 | 2/2018 | Ito et al. | |
| 9,935,426 | B2 | 4/2018 | Kaneko | |
| 9,948,063 | B2 | 4/2018 | Caneau et al. | |
| 10,004,408 | B2 | 6/2018 | Naima | |
| 10,060,788 | B2 | 8/2018 | Fei | |
| 10,098,555 | B2 | 10/2018 | Yamaji | |
| 10,181,696 | B2 | 1/2019 | Evans et al. | |
| 10,215,698 | B2 | 2/2019 | Han et al. | |
| 10,319,878 | B2 | 6/2019 | Ulmer et al. | |
| 10,413,362 | B2 | 9/2019 | Griffin | |
| 10,433,739 | B2 | 10/2019 | Weekly et al. | |
| 10,535,979 | B2 | 1/2020 | Audet et al. | |
| 10,687,718 | B2 | 6/2020 | Allec et al. | |
| 10,697,830 | B1 | 6/2020 | Kangas et al. | |
| 10,788,368 | B2 | 9/2020 | Pelc et al. | |
| 10,852,492 | B1 | 12/2020 | Vermeulen et al. | |
| 11,158,996 | B2 | 10/2021 | Bismuto et al. | |
| 11,171,464 | B1 | 11/2021 | Bishop et al. | |
| 2002/0018507 | A1 * | 2/2002 | Deacon | G02B 6/136 372/20 |
| 2002/0090011 | A1 * | 7/2002 | Pezeshki | H01S 5/4031 372/20 |
| 2002/0150131 | A1 * | 10/2002 | Tsukiji | H01S 5/06804 372/34 |
| 2002/0181521 | A1 | 12/2002 | Crowder et al. | |
| 2004/0104213 | A1 * | 6/2004 | Lano | H01S 5/06825 219/494 |
| 2004/0126117 | A1 | 7/2004 | Lo et al. | |
| 2004/0174915 | A1 | 9/2004 | Sarlet et al. | |
| 2004/0255318 | A1 | 12/2004 | Braetberg et al. | |
| 2005/0169327 | A1 * | 8/2005 | Eden | H01S 5/4031 372/32 |
| 2005/0226290 | A1 * | 10/2005 | De La Grandiere | H01L 31/101 372/33 |
| 2006/0088068 | A1 | 4/2006 | Farrell et al. | |

(56) References Cited

U.S. PATENT DOCUMENTS

| | | |
|---|---|---|
| 2006/0197753 A1 | 9/2006 | Hotelling |
| 2007/0116076 A1 | 5/2007 | Wang et al. |
| 2007/0247241 A1* | 10/2007 | Braun ................ G04F 5/14 331/94.1 |
| 2008/0063016 A1* | 3/2008 | Bhatia ............ H01S 5/06256 372/34 |
| 2008/0075132 A1* | 3/2008 | Hu ................ H01S 5/0612 372/34 |
| 2008/0310470 A1 | 12/2008 | Ooi et al. |
| 2009/0135861 A1* | 5/2009 | Webster ............ H01S 5/141 372/20 |
| 2010/0231683 A1* | 9/2010 | Niwa ................ B41J 2/471 315/291 |
| 2013/0292571 A1 | 11/2013 | Mukherjee et al. |
| 2016/0296173 A1 | 10/2016 | Culbert |
| 2016/0329681 A1* | 11/2016 | Tulip ............ H01S 5/06804 |
| 2017/0033531 A1* | 2/2017 | Treese ............ H01S 5/02325 |
| 2017/0045450 A1 | 2/2017 | Lieber et al. |
| 2017/0249445 A1 | 8/2017 | Devries et al. |
| 2017/0325744 A1 | 11/2017 | Allec et al. |
| 2018/0054038 A1* | 2/2018 | Kim ................ H01S 5/22 |
| 2018/0083421 A1 | 3/2018 | Audet et al. |
| 2018/0183207 A1 | 6/2018 | Audet et al. |
| 2018/0242892 A1 | 8/2018 | Schie |
| 2020/0153202 A1 | 5/2020 | Audet et al. |
| 2022/0006267 A1 | 1/2022 | Bismuto et al. |
| 2022/0131340 A1 | 4/2022 | Bishop et al. |

FOREIGN PATENT DOCUMENTS

| | | |
|---|---|---|
| EP | 2091118 | 8/2009 |
| EP | 2120301 | 11/2009 |
| EP | 2849294 | 3/2015 |
| EP | 2992821 | 3/2016 |
| GB | 2380058 | 3/2003 |
| JP | 04116878 | 4/1992 |
| JP | 2000-163031 A | 6/2000 |
| JP | 2002-342033 A | 11/2002 |
| JP | 2005175021 | 6/2005 |
| JP | 2010503987 | 2/2010 |
| JP | 2015115411 | 6/2015 |
| WO | WO 96/011416 | 4/1996 |
| WO | WO 08/033251 | 3/2008 |
| WO | WO 16/144831 | 9/2016 |
| WO | WO 16/176364 | 11/2016 |
| WO | WO 17/197033 | 11/2017 |

OTHER PUBLICATIONS

Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.

Rubine, D.H. (May 1992). "Combining Gestures and Direct Manipulation," CHI '92, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

He et al., "Integrated Polarization Compensator for WDM Waveguide Demultiplexers," IEEE Photonics Technology Letters vol. 11, No. 2, Feb. 1999, pp. 224-226.

Tohmori, et al., "Broad-Range Wavelength-Tunable Superstructure Grating (SSG) DBR Lasers," IEEE Journal of Quantum Electronics, vol. 29, No. 6, Jun. 1993, pp. 1817-1823.

* cited by examiner

INTEGRATED LASER SOURCE

CROSS-REFERENCE TO RELATED APPLICATIONS

This application claims benefit of U.S. Provisional Patent Application No. 62/564,554, filed Sep. 28, 2017, the entire disclosure of which is incorporated herein by reference for all purposes.

FIELD OF THE DISCLOSURE

This disclosure relates to a multi-wavelengths integrated laser source and methods for operating thereof. More specifically, this disclosure relates to multi-wavelengths integrated laser source including one or more heaters.

BACKGROUND OF THE DISCLOSURE

Optical spectroscopy is an analytical technique. Conventional systems and methods for optical spectroscopy can include emitting light. A portion of the light energy can be absorbed at one or more wavelengths. This absorption can cause a change in the properties of the return light.

The characteristics of semiconductor lasers can make lasers a suitable choice as light sources configured to emit light for optical spectroscopy applications. For example, lasers can have single frequency emissions with narrow linewidths and can be capable of being tuned to emit at target emission wavelengths. The precision and accuracy of the emission wavelengths can be important for achieving quantitatively accurate spectroscopic measurements for some applications. In some instances, optical spectroscopy may benefit from multi-wavelengths measurements. Multi-wavelengths integrated laser sources with stable and accurate emissions wavelengths while being insensitive to thermal transients and crosstalk between lasers can be desired.

SUMMARY OF THE DISCLOSURE

Integrated laser sources emitting multi-wavelengths of light with reduced thermal transients and crosstalk and methods for operating thereof are disclosed. The integrated laser sources can include one or more heaters, which can be capable of generating heat. With the addition of one or more heaters, a temperature control system can be configured to maintain a total thermal load of both the gain segment and heater(s) of a given laser to be within a range based on a predetermined target value. The system can include electrical circuitry configured to distribute current generated from the current source to the gain segment, the heater(s), or both. In some examples, the gain segment and heater(s) can be coupled (e.g., directly connected) to separate current sources. The one or more heaters included in the structure of the laser can be either symmetrically or asymmetrically located with respect to the gain segment, where the percentage of distribution of current by the circuitry can be based on the relative locations. In some examples, heaters from proximate lasers and/or heater(s) proximate to a gain segment within a laser can be used to heat a central laser prior to the central laser being activated. In some examples, one or more of the plurality of lasers can operate in a subthreshold operation mode when the laser is not lasing to minimize thermal perturbations to proximate (e.g., adjacent) lasers.

DETAILED DESCRIPTION

Figure 1:
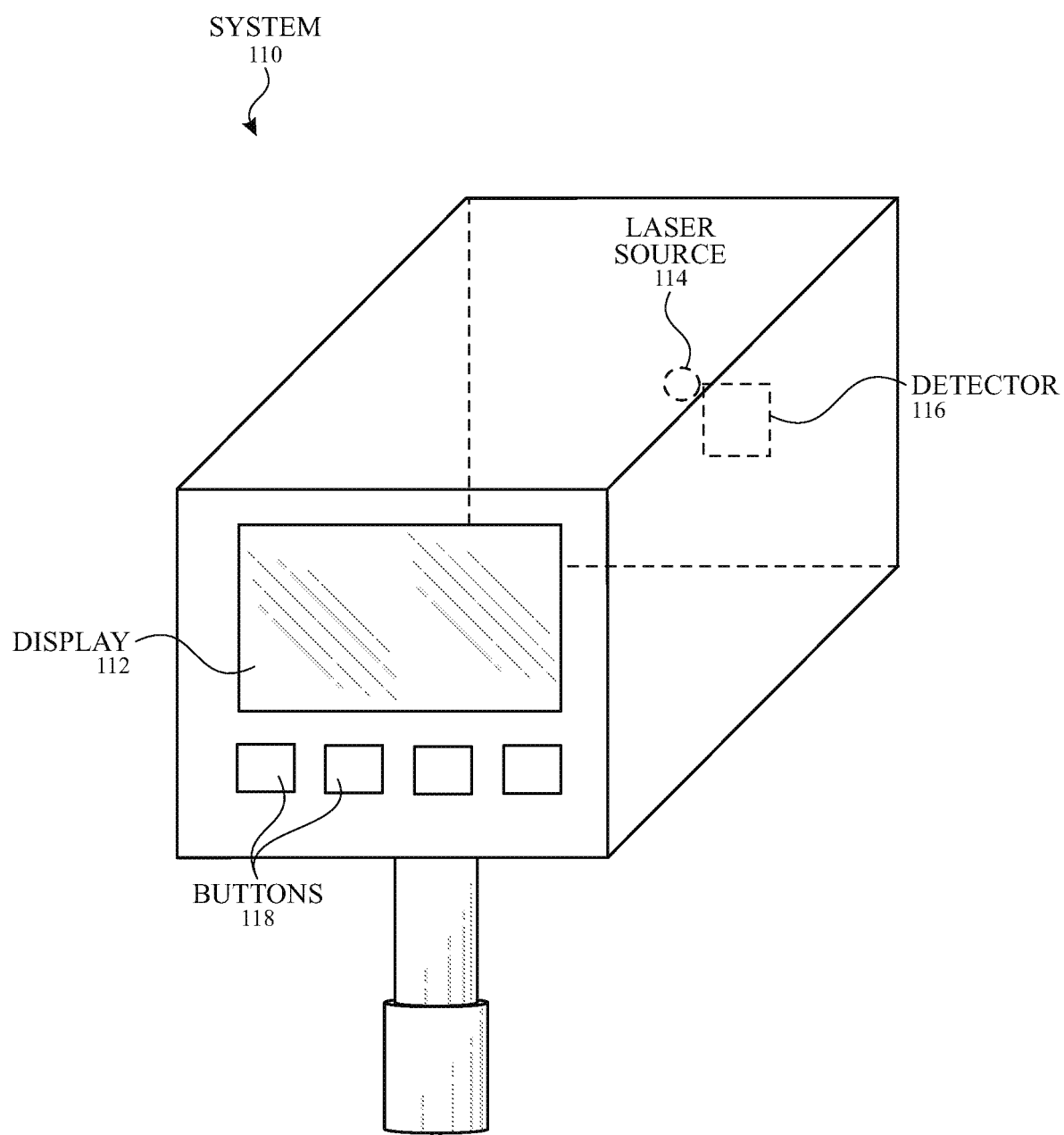
FIG. 1 illustrates an exemplary system in which examples of the disclosure can be implemented.

In the following description of examples, reference is made to the accompanying drawings in which it is shown by way of illustration specific examples that can be practiced. It is to be understood that other examples can be used and structural changes can be made without departing from the scope of the various examples.

Various techniques and process flow steps will be described in detail with reference to examples as illustrated in the accompanying drawings. In the following description, numerous specific details are set forth in order to provide a thorough understanding of one or more aspects and/or features described or referenced herein. It will be apparent, however, to one skilled in the art, that one or more aspects and/or features described or referenced herein may be practiced without some or all of these specific details. In other instances, well-known process steps and/or structures have not been described in detail in order to not obscure some of the aspects and/or features described or referenced herein.

Further, although process steps or method steps can be described in a sequential order, such processes and methods can be configured to work in any suitable order. In other words, any sequence or order of steps that can be described in the disclosure does not, in and of itself, indicate a requirement that the steps be performed in that order. Further, some steps may be performed simultaneously despite being described or implied as occurring non-simultaneously (e.g., because one step is described after the other step). Moreover, the illustration of a process by its depiction in a drawing does not imply that the illustrated process is exclusive of other variations and modification thereto, does not imply that the illustrated process or any of its steps are necessary to one or more of the examples, and does not imply that the illustrated process is preferred.

Disclosed herein are multi-wavelengths integrated laser sources and methods for operating thereof with reduced thermal transients and crosstalk. One or more of the integrated laser sources can include one or more heaters, which can be capable of generating heat. With the addition of one or more heaters, a temperature control system can be configured to maintain a total thermal load of both the gain segment and heater(s) of a given laser within a range based on a predetermined target value. The system can include an electrical switch configured to distribute current generated from the current source to either the gain segment and/or the heater(s). In some examples, the gain segment and heater(s) can be coupled to separate current sources. The one or more heaters included in the structure of the laser can be either symmetrically or asymmetrically located with respect to the gain segment, where the percentage of distribution of current by the switch can be based on the relative locations. In some examples, heaters from adjacent lasers and/or heater(s) adjacent to a gain segment within a laser can be used to heat a central laser prior to the central laser being activated. In some examples, one or more of the plurality of lasers can operate in a subthreshold operation mode when the laser is not lasing to minimize thermal perturbations to adjacent lasers.

Representative applications of methods and apparatuses according to the present disclosure are described in this section. These examples are provided solely to add context and aid in the understanding of the described examples. It will be apparent to one skilled in the art that the described examples may be practiced without some or all of the specific details. Other applications are possible, such that the following examples should not be taken as limiting.

FIG. 1 illustrates an exemplary system in which examples of the disclosure can be implemented. System 110 can include a display 112, laser source 114, detector 116, and buttons 118. Laser source 114 can be configured to emit multiple wavelengths of light. More specifically, laser source 114 can include one or more semiconductor lasers. In some instances, some or all of the individual semiconductor lasers may be tunable, which may provide for adjustments to the wavelengths emitted by an individual semiconductor laser. Although typically used in large, bulky systems, semiconductor lasers can have many uses (e.g., trace gas detection, environmental monitoring, biomedical diagnostics, telecommunications, and industrial process controls) in portable electronic devices. Buttons 118 can be provided for the user to provide input to system 110. System 110 can output information to the user on the display 112 and can optionally transmit the information to a remote computer. In response, the remote computer can receive and store the information for tracking purposes.

Systems and methods for optical spectroscopy can include emitting light using a light source. The wavelength emitted by a light source (e.g., a laser source) can depend on the temperature of the light source, where any change in temperature can cause a shift in wavelength (i.e., a deviation from the target wavelength). For example, light emitted by a semiconductor laser can shift 0.1-1 nm/K, which can depend on the materials used and the design of the laser. When multiple lasers are positioned in close proximity to each other, waste heat generated by the operation of one or more lasers may alter the temperature of a nearby laser, which may then alter the emission wavelength of that laser.

In some examples, when the amplitude of the lasers are modulated (e.g., by changing the drive currents), resulting thermal effects can cause transient wavelength shifts. Closed-loop temperature control of a laser (e.g., of the laser cladding, the chip substrate, etc.) or its surroundings can be used to reduce the temperature swings, and such control may be limited in how much it can mitigate external perturbations, how quickly the control may correct for temperature perturbations, etc. For example, there can be a non-zero delay between any active temperature control and resultant effects. Thus, even a system with closed-loop temperature control may experience some transient wavelength effects caused by the amplitude modulation of the lasers.

The transient effects can be multiplied in instances where multiple layers may be placed in close proximity to each other. Although optical spectroscopy generally can require at least two wavelengths, certain applications can be better suited with a greater number of distinct wavelengths of emitted light. In some spectroscopic applications (e.g., applications where narrow spectroscopic absorption features can be measured or highly precise quantifications can be made), producing highly accurate wavelengths can be beneficial. Highly accurate wavelengths can include no more than 0.01 nm deviations from a target wavelength, for example.

Figure 2A:
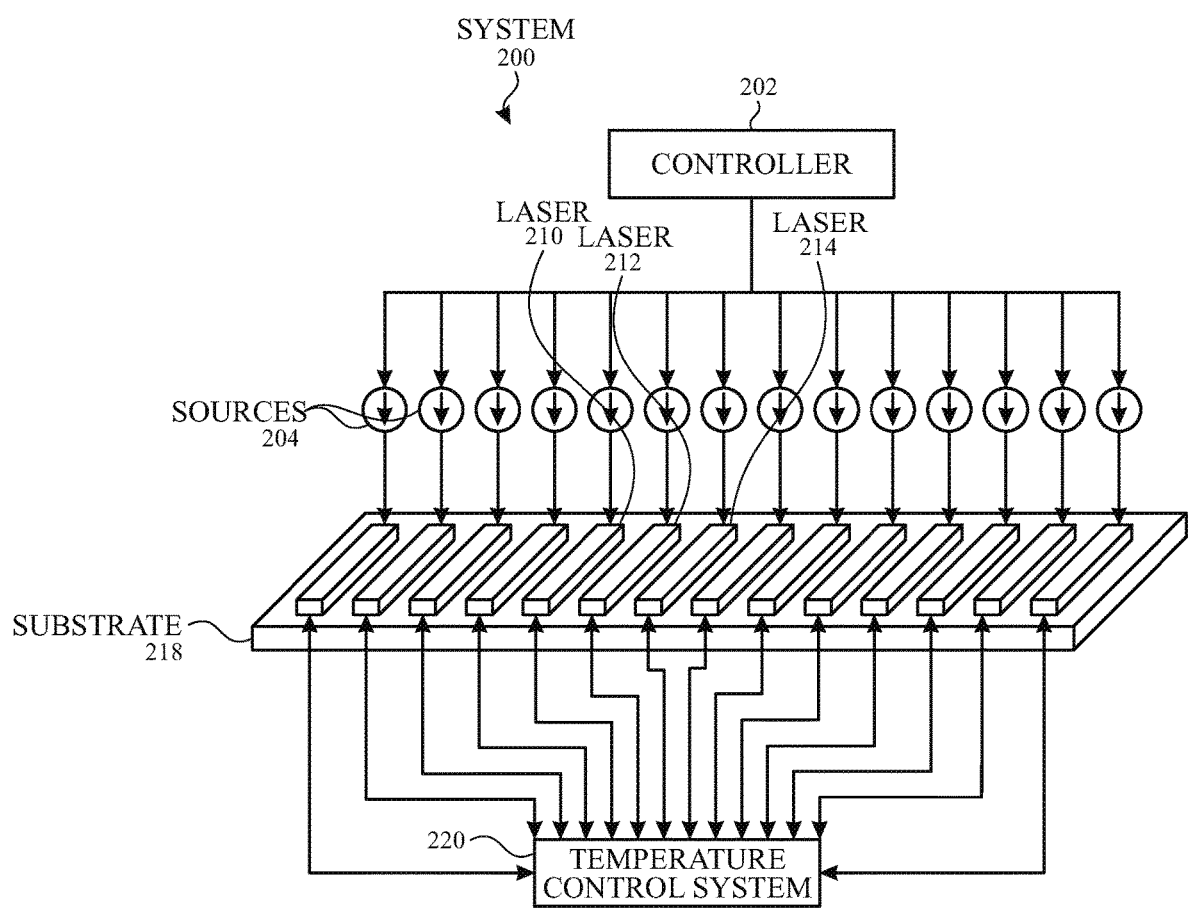
FIG. 2A illustrates an exemplary arrangement of a plurality of lasers included in a system according to examples of the disclosure.

For spectroscopy systems including a plurality of lasers configured to emit a plurality of distinct wavelengths, each laser can experience transient effects. Additionally, a plurality of the lasers can be arranged in close proximity to one another (e.g., in portable electronic devices), which can cause the lasers to be susceptible to thermal crosstalk. FIG. 2A illustrates an exemplary arrangement of a plurality of lasers included in a system according to examples of the disclosure. System 200 can include a plurality (e.g., at least 3-10) of lasers, such as laser 210, laser 212, and laser 214, located proximate to one another. The plurality of lasers can be formed on substrate 218 (e.g., a die, chip, or wafer). For example, the plurality of lasers can be formed using lithographic means. In some examples, the integration can be based on silicon waveguides (e.g., silicon photonics) and/or indium phosphide (InP) waveguides. For example, the reflective section(s) (e.g., grating section(s)), gain section, and heater(s) of each laser can be included on the same III-V substrate. Alternatively, the reflective section(s) (e.g., grating section(s)) of each laser can be included on the same silicon substrate, while the gain section and heater(s) of each laser can be included on the same III-V substrate.

In some examples, the separation distance between adjacent lasers can be 10-100 μm. For example, laser 212 can be adjacent to and located between laser 210 and laser 214. The plurality of lasers can be integrated using, for example, wafer-bonding, evanescent coupling, grating coupling, butt-coupling (e.g., near-field facet coupling), epitaxial growth, or any other suitable means. In some instances, once formed and integrated, the outputs of some or all of the plurality of lasers can be combined.

The plurality of lasers can be coupled to voltage or current sources 204, which can be coupled to controller 202. Controller 202 can send one or more signals to each source 204, which can be indicative of a drive current (or voltage) to one or more of the plurality of lasers. In some examples, each laser can be coupled to a unique (i.e., not shared with other lasers) source 204. In some examples, more than one laser can be coupled to the same source 204.

In some examples, the plurality of lasers can be coupled to a single temperature control system 220 or multiple temperature control systems. Temperature control system 220 can, in some instances, include a closed-loop temperature control system configured to measure the temperature of the plurality of lasers, compare the measured temperature(s) to target temperature(s), and/or control the temperature(s) when a difference between the measured and target temperatures exists. Temperature control system 220 can include a plurality of temperature sensors. Each laser can be coupled to a separate temperature sensor(s). In some examples, controller 202 can be in communication with temperature control system 220. In some examples, controller 202 can include temperature control system 220.

The plurality of distinct wavelengths of emitted light can be generated by a plurality of light sources (e.g., laser sources), where each (or some) of the plurality of light sources can be configured to emit one or more wavelengths distinct from some or all of the wavelengths emitted by other light sources. Thereby, a system capable of multi-wavelengths spectroscopic measurements can be created. The lasers can be switched on (and off) simultaneously, in a sequence, or driven with a predetermined amplitude modulation pattern (e.g., simple sequencing of wavelengths in a predetermined order, sine-wave modulation for FFT analysis, Hadamard schemes, etc.).

Figure 2B:
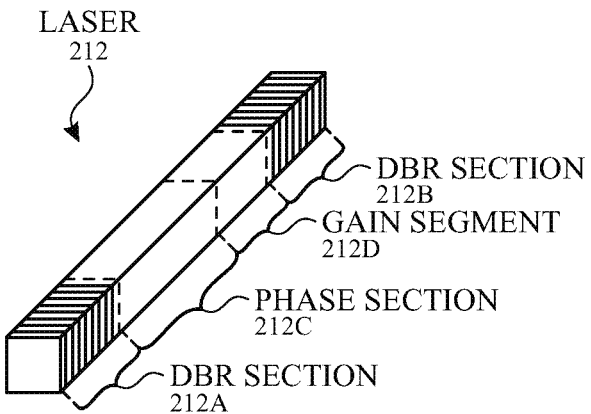
FIG. 2B illustrates a perspective view of an exemplary laser according to examples of the disclosure.

FIG. 2B illustrates a perspective view of an exemplary laser according to examples of the disclosure. Shown is one exemplary laser; in some examples, each of the plurality of lasers included in system 200 can have the same design and/or operation. Laser 212 can be configured as a Distributed Bragg Reflector (DBR) laser, which can include DBR section 212A, phase section 212C, gain region or gain segment 212D, and DBR section 212B. DBR section 212A and DBR section 212B can include one or more diffraction gratings located on or above the active region (not shown). The diffraction gratings can be configured to provide optical feedback to at least partially reflect light back into the cavity of the laser to form a resonator. In some examples, the diffraction gratings can be configured to reflect only narrow bands of wavelength(s) to produce a single longitudinal mode wavelength. The period of the gratings can be adjusted to achieve specific emission wavelengths. DBR section 212A can be configured to have partial transmission and can be configured as an outcoupler, while DBR section 212B can be configured to have complete reflection.

Although FIG. 2B illustrates a laser including DBR sections, examples of the disclosure can include reflective sections (e.g., a metal mirror at the rear facet of the laser). Additionally, examples of the disclosure are not limited to DBR lasers and the disclosure herewith can be applicable to any type of laser.

In some examples, laser 212 can be a sampled-grating DBR (SGDBR), which can include DBR section 212A and DBR section 212B configured with distinct combs of reflection peaks. The SGDBR can be a highly tunable laser with independent shifting of the reflection peaks using temperature or current injection.

Phase section 212C can be configured for tuning by aligning the cavity mode (i.e., lasing wavelength) to the peaks of the DBR reflectivity spectra. In some examples, phase section 212C can be omitted from laser 212. Gain segment 212D can be configured to amplify light energy. In some examples, gain segment 212D can be a III-V gain segment.

Heat from any of the sections (e.g., DBR section 212A, phase section 212C, gain segment 212D, and DBR section 212B) of laser 212 can spread to any of the other sections. In some examples, one or more of the DBR and phase sections can be coupled to a temperature sensor included in a temperature control system (e.g., temperature control system 220 illustrated in FIG. 2A). While the DBR and phase sections may be temperature controlled (e.g., nominally held at a nearly target temperature), gain segment 212D can be affected by changes in generated heat (e.g., from the laser being driven by a current source). For example, source 204 can reduce the drive current of gain segment 212D of laser 212. The lower drive current can lead to a reduced heat load in gain segment 212D, which can lead to a drop in the temperature of gain segment 212D. The temperature drop in gain segment 212D can cause an increase in heat flow between gain segment 212D and one or more of DBR section 212A, DBR section 212B, and phase section 212C. Alternatively, the temperature drop in gain segment 212D can lead to a decrease in heat flow in the opposite direction.

Temperature control system 220 can detect the change in temperature within a given laser (e.g., laser 212) and can try to correct for the change in heat flow (e.g., increasing the amount of applied heat to gain segment 212D). In some examples, temperature control system 220 can maintain a small change in steady-mode temperature and can likely require a finite time period to correct for the change in heat flow. Although temperature control system 220 can maintain a small change in steady-mode temperature, finite gain and/or non-zero thermal impedance between the DBR sections (e.g., DBR section 212A and DBR section 212B) or phase section 212C and corresponding temperature sensors can lead to imperfect temperature control by temperature control system 220.

Figure 2C:
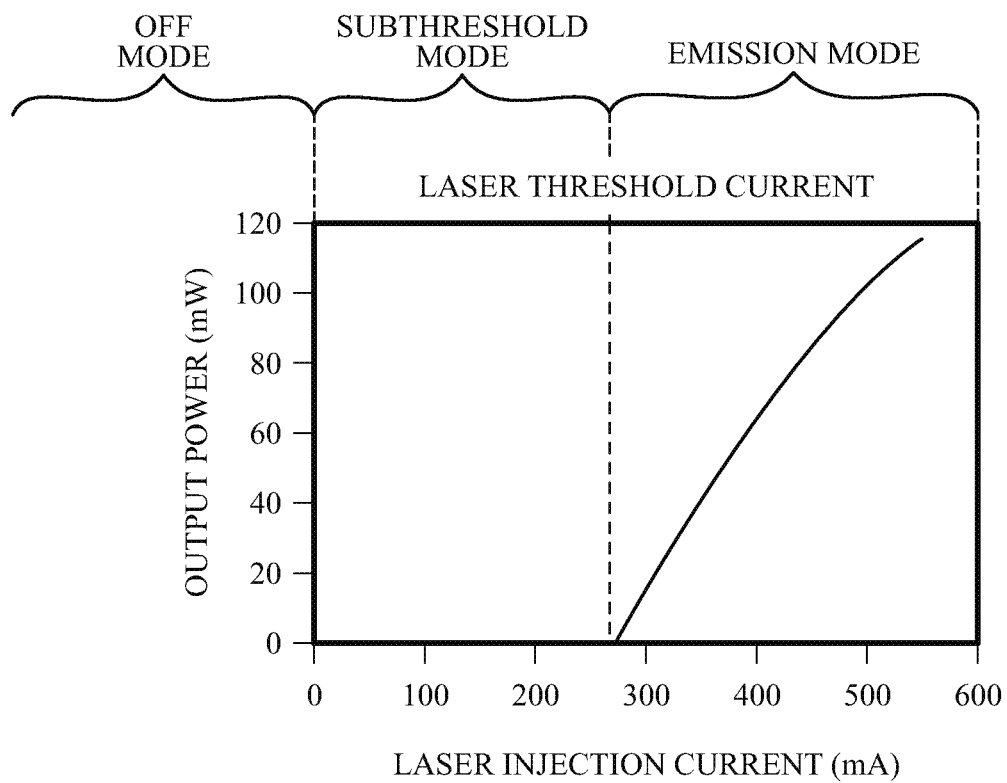
FIG. 2C illustrates an exemplary relationship between laser injection current and laser output power according to examples of the disclosure.

A laser can experience the heating effects even when the laser is not emitting light (i.e., the laser output power is equal to zero). For example, a laser can experience heat from a nearby laser. FIG. 2C illustrates an exemplary relationship between laser injection current and laser output power according to examples of the disclosure. The operation mode of the laser can be categorized as off, subthreshold, or emission. When the laser is operating in the off mode, no injection current is provided to the laser. The injection current refers to the current input to the laser from a source and used to drive the laser to a non-off operation mode. The laser can be operating in the subthreshold operation mode when some injection current may be provided to the active region of a laser and the injection current is below the laser threshold current. Within the subthreshold operation mode, the laser output power can be zero. The laser can be operating in the emission operation mode when the injection current is above the laser threshold current and can generate light. The laser output power can be greater than zero and can be linearly dependent on the injection current, for a given submount temperature. The slope efficiency of the laser can be determined based on this linear dependency. At high injection currents, this linear dependence can break down due to an increase in the temperature of the active region. The increase in temperature of the active region can cause a decrease in internal quantum efficiency, which in turn can cause the output power to saturate (i.e., thermal rollover).

Even though the laser output power can be effectively zero below the laser threshold current, driving the laser (i.e., increasing the laser injection current) can still lead to significant heat generation. Furthermore, power consumption and heat generation can come from sections in the laser structure other than the laser gain medium.

In addition to thermal impacts from sections within a given laser, a laser, when configured in the arrangement shown in FIG. 2A, can experience thermal crosstalk, where the modulation of at least one laser can thermally affect a nearby (e.g., adjacent) laser. For example, laser 212 (illustrated in FIG. 2A) can experience thermal crosstalk from laser 210 and/or laser 214. Accordingly, a system capable of reducing the driving transients of a thermal load to reduce the magnitude of thermally-induced wavelength transients within a given laser and a system capable of reducing the magnitude of thermally-induced wavelength crosstalk transients between nearby lasers may be desired. In some examples, a system capable of reducing the magnitude of thermally-induced amplitude transients within a given laser and thermally-induced amplitude crosstalk transients between nearby lasers may be desired.

Figure 3A:
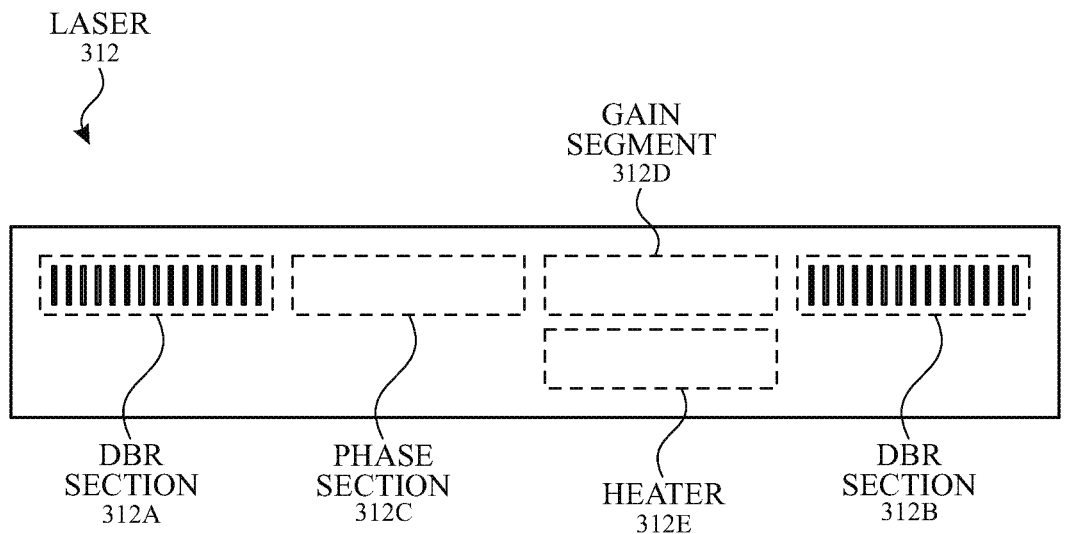
FIG. 3A illustrates a top view of an exemplary laser including an integrated heater according to examples of the disclosure.

In some examples, the laser can include a heater to reduce thermal transients and crosstalk. The heater can be located proximate to the gain segment and can include materials common to the gain segment. FIG. 3A illustrates an exemplary laser including an integrated heater according to examples of the disclosure. Laser 312 can include DBR section 312A, DBR section 312B, phase section 312C, and gain segment 312D. One or more of DBR section 312A, DBR section 312B, phase section 312C, and gain segment 312D can have a design and/or operation similar to DBR section 212A, DBR section 212B, phase section 212C, and gain segment 212D, respectively, as discussed above and illustrated in FIG. 2B.

Laser 312 can further include heater 312E. In some examples, heater 312E can be any type of element capable of generating heat, including but not limited to a resistor (e.g., patterned metal or lightly-doped, ohmic semiconductor material). In some examples, heater 312E can have one or more material properties (e.g., same epitaxial structure) that can be the same as gain segment 312D. The heater 312E may be thermally coupled to the gain segment 312D. The term "thermal coupling" and "thermally coupled" refer to a connection (e.g., a thermal path) between two or more components for transferring heat between the components.

In some examples, heater 312E may not be optically coupled to the laser cavity. The terms "optical coupling" and "optically coupled" refer to a connection (e.g., an optical path) between two or more components for transferring an optical signal between the components, and "optical decoupling" refers to the lack of such connection. For example, the heater 312E may be optically decoupled from the gain segment 312D, thereby preventing an optical signal from the gain segment 312D from transferring to the heater 312E. The heater 312E can be fabricated and operated differently from the gain segment 312D.

A temperature control system (e.g., temperature control system 220 illustrated in FIG. 2A) can be coupled to gain segment 312D and heater 312E. In some examples, separate temperature sensors can be coupled to gain segment 312D and heater 312E, and the temperature control system can individually control the temperatures of gain segment 312D and heater 312E. In some examples, a single temperature sensor can be coupled to both gain segment 312D and heater 312E, and the temperature control system can control the total thermal load of both gain segment 312D and heater 312E. The term "thermal load" refers to the amount of heat generated by a given component. In some examples, a single temperature sensor can be coupled to gain segment 312D, and the temperature values can be used as input information to the one or more heaters. In some instances, the temperature control system may not monitor the temperature of the gain segment 312D, but may instead apply a certain current or voltage to the gain segment 312D, where the applied current/voltage may be based on a targeted temperature value.

The temperature control system can be configured to maintain a total thermal load of both gain segment 312D and heater 312E to be within a range of a predetermined target value. That is, if the thermal load of gain segment 312D is represented by $TL_{GS}$ and the thermal load of heater 312E is represented by $TL_{HG}$, the temperature control system can be configured to maintain ($TL_{GS}+TL_{HG}$) within the range (e.g., within 10% from the target value).

As the drive current to gain segment 312D decreases, for example, the temperature of gain segment 312D can decrease, and the current to heater 312E can increase. With the current to heater 312E increasing, the temperature of heater 312E can increase. The temperature control system can ensure that while the temperature of gain segment 312D decreases, the change in total thermal load can be zero. If heater 312E is a gain segment (like gain segment 312D), since heater 312E may be optically decoupled from the laser cavity, heater 312E may not lase when electrically energized.

In some examples, the temperature control system can be further configured to maintain DBR section 312A, DBR section 312B, and/or phase section 312C at target temperatures. The temperature control system can be configured to maintain target temperature in one or more sections (e.g., DBR section 312A, DBR section 312B, phase section 312C, and gain segment 312D and heater 312E) when the laser is in the off operation mode (i.e., no injection current is applied to the laser, as illustrated in FIG. 2C), subthreshold operation mode (i.e., a non-zero injection current below the laser threshold current is applied to the laser, as illustrated in FIG. 2C), and/or emission operation mode (i.e., an injection current greater than or equal to the laser threshold current is applied, such that the laser can be emitting light, as illustrated in FIG. 2C).

With laser 312 including heater 312E, the required swing in phase-section heating current can be reduced. Less required swing in phase-section heating current can lead to a reduced load on the temperature control system (e.g., temperature control system 220 illustrated in FIG. 2A). In some instances, the temperature control system can achieve steady-mode faster and can consume less power due to the reduced load. Moreover, the perturbations in the total cavity optical phase can be reduced, which can reduce the likelihood of mode-hops.

Figure 3B:
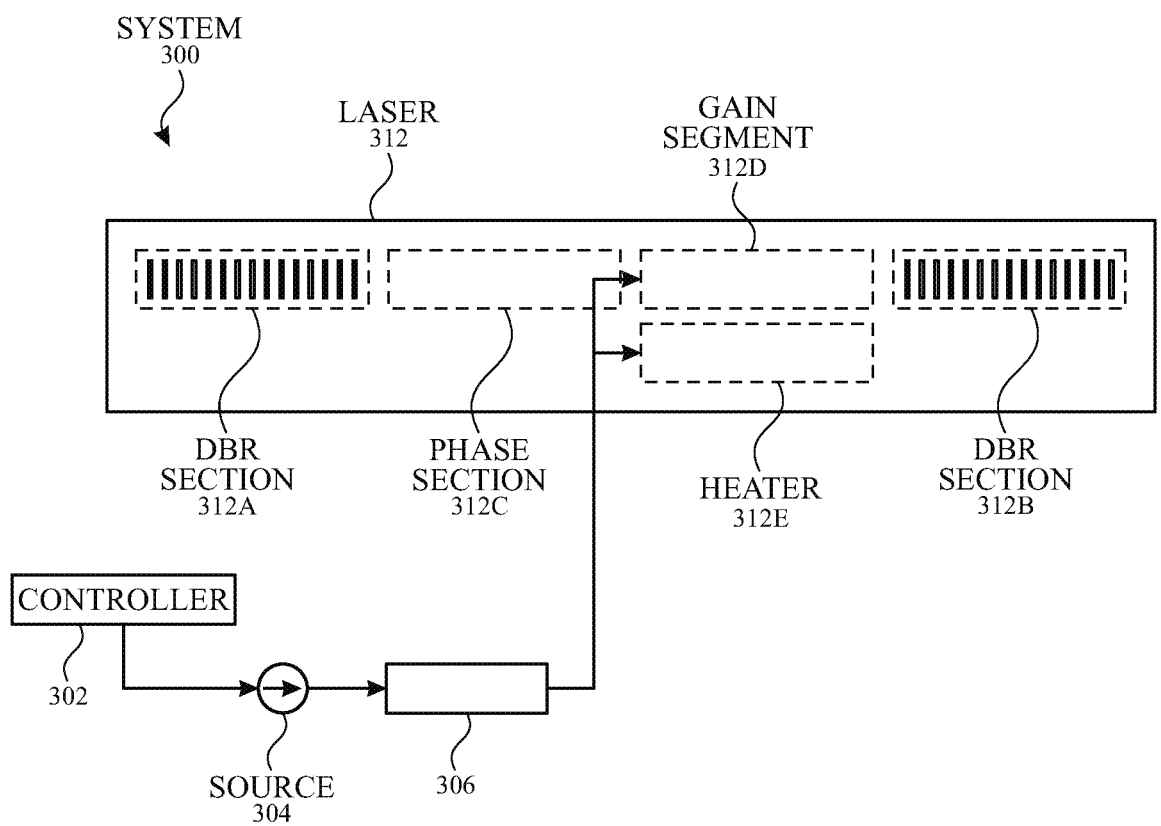
FIG. 3B illustrates a partial schematic diagram of an exemplary laser including a heater and circuitry configured to couple a source to the gain segment and heater according to examples of the disclosure.

FIG. 3B illustrates a partial schematic diagram of an exemplary configuration of the system including lasers having heaters according to examples of the disclosure. System 300 can include controller 302, one or more sources (e.g., source 304), one or more circuitry 306 (e.g., a switch, a splitter, etc.), and one or more lasers (e.g., laser 312). Source 304 can be a fixed current source configured to generate a predetermined and constant current. The current from source 304 can flow into circuitry 306. Circuitry 306 can be any electrical (e.g., analog or digital) switch including, but not limited to a CMOS nFET switch. In some examples, circuitry 306 can direct the current into either gain segment 312D or heater 312E. In some examples, gain segment 312D and heater 312E can be configured with the same electrical properties (e.g., resistivity), which can prevent or reduce the effect of switching operations, performed by circuitry 306, on source 304. Alternatively, circuitry 306 can be configured to share the current from source 304 between gain segment 312D and heater 312E. Although FIG. 3B illustrates a single source (e.g., source 304) being shared between gain segment 312D and heater 312E, examples of the disclosure can include the gain segment and heater(s) being electrically coupled to separate sources (not shown).

Figure 3C:
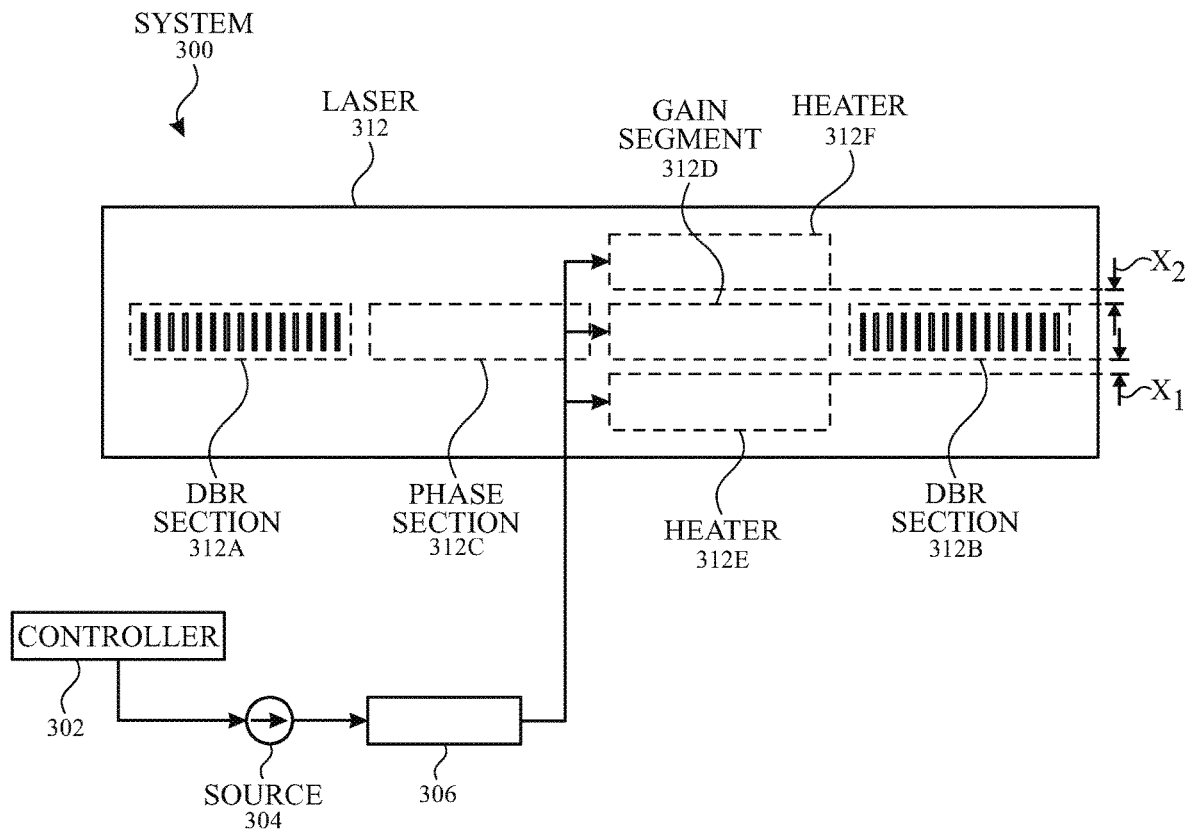
FIG. 3C illustrates a partial schematic diagram of an exemplary laser including multiple heaters according to examples of the disclosure.

In some examples, a laser can include multiple heaters. FIG. 3C illustrates an exemplary laser including multiple heaters according to examples of the disclosure. Laser 312 can further include heater 312F. In some examples, heater 312F can be located on the other side of gain segment 312D than heater 312E is located. In some examples, heater 312F can have the same properties and/or performance (e.g., electrical properties and/or thermal performance) as heater 312E. In some examples, circuitry 306 can be electrically coupled to gain segment 312D, heater 312E, and heater 312F. Circuitry 306 can be dynamically configured (or dynamically reconfigured) to direct the current from source 304 to segment 312D, heater 312E, or heater 312F. The term "dynamic" refers to performing an action in real-time. A dynamic action may not include actions that are pre-determined, for example. In some examples, a junction (e.g., y-junction) can be used to divide (e.g., 33% each) the current from source 304 to the three different sections of laser 312. In some examples, the junction can split (e.g., 50%) the current from source 304 between heater 312E and heater 312F.

The separation distance between heater 312E and gain segment 312D, as measured from edge-to-edge, can be $x_1$. The separation distance between heater 312F and gain segment 312D, as measured edge-to-edge, can be $x_2$. Both heater 312E and heater 312F can be configured to heat up gain segment 312D. In some examples, heating of gain segment 312D by the heaters can be limited to when laser 312 is off. The amount of heat experienced by gain segment 312D can depend on the current from source 304 and the separation distance from a given heater. In some examples, the separation distances $x_1$ and $x_2$ can be the same, and in some instances, the heaters can be symmetrically placed relative to gain segment 312D. Circuitry 306 can be configured to route a portion (e.g., half) of the current from source 304 to heater 312E and the other portion of the current to heater 312F.

In some examples, the separation distances $x_1$ and $x_2$ can be different, and in some instances, the heaters can be asymmetrically placed relative to gain segment 312D. Circuitry 306 can be configured to distribute unequal amounts of current from source 304. For example, separation distance $x_2$ can be equal to 1.5 times the separation distance $x_1$, and circuitry 306 can route 60% of the current from source 304 to heater 312F and 40% of the current to heater 312E.

Figure 3D:
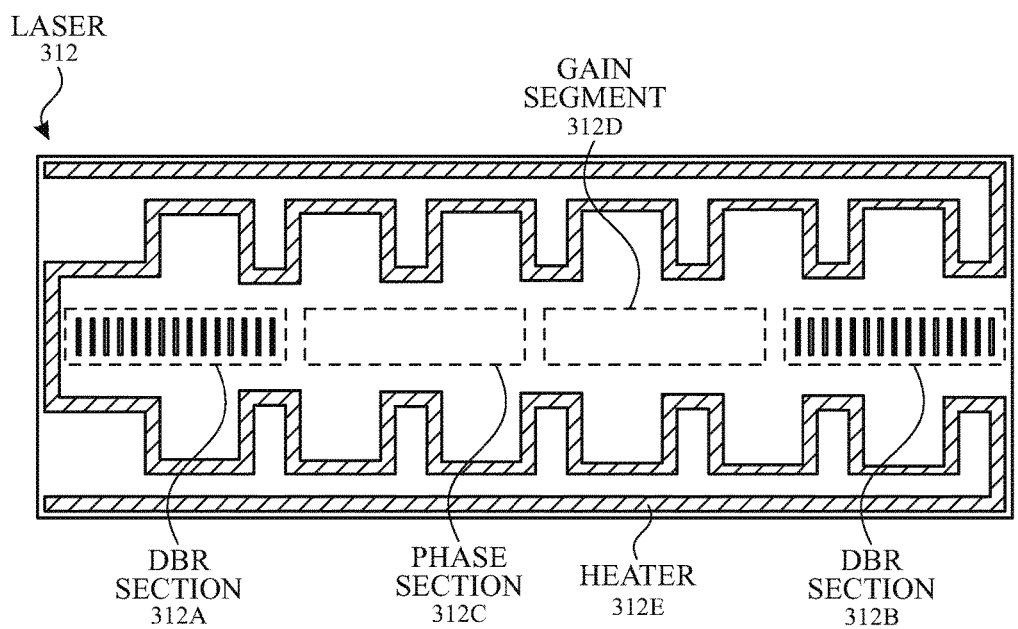
FIG. 3D illustrates a top view of an exemplary laser including a serpentine heater according to examples of the disclosure.

Examples of the disclosure can include the heater having any type of shape and/or size. FIG. 3D illustrates a top view of an exemplary laser including a serpentine heater according to examples of the disclosure. Heater 312E can include, for example, a metal (e.g., aluminum) routed around one or more sides of gain segment 312D. In some examples, the serpentine heater can have a length longer than the length(s) of the edge(s) of the laser that serpentine heater runs along. Heater 312E can be coupled to a current source, where current running through the metal can lead to heat dissipation, which can thermally couple to gain segment 312D. Although the figure illustrates the serpentine heater routed along two edges of laser 312, examples of the disclosure can include the heater routed along one or more than two edges of laser 312. Additionally, although the figure illustrates the serpentine heater weaving back and forth along two edges of laser 312, examples of the disclosure can include patterns or techniques to lengthen the metal or increase its resistance.

Figure 3E:
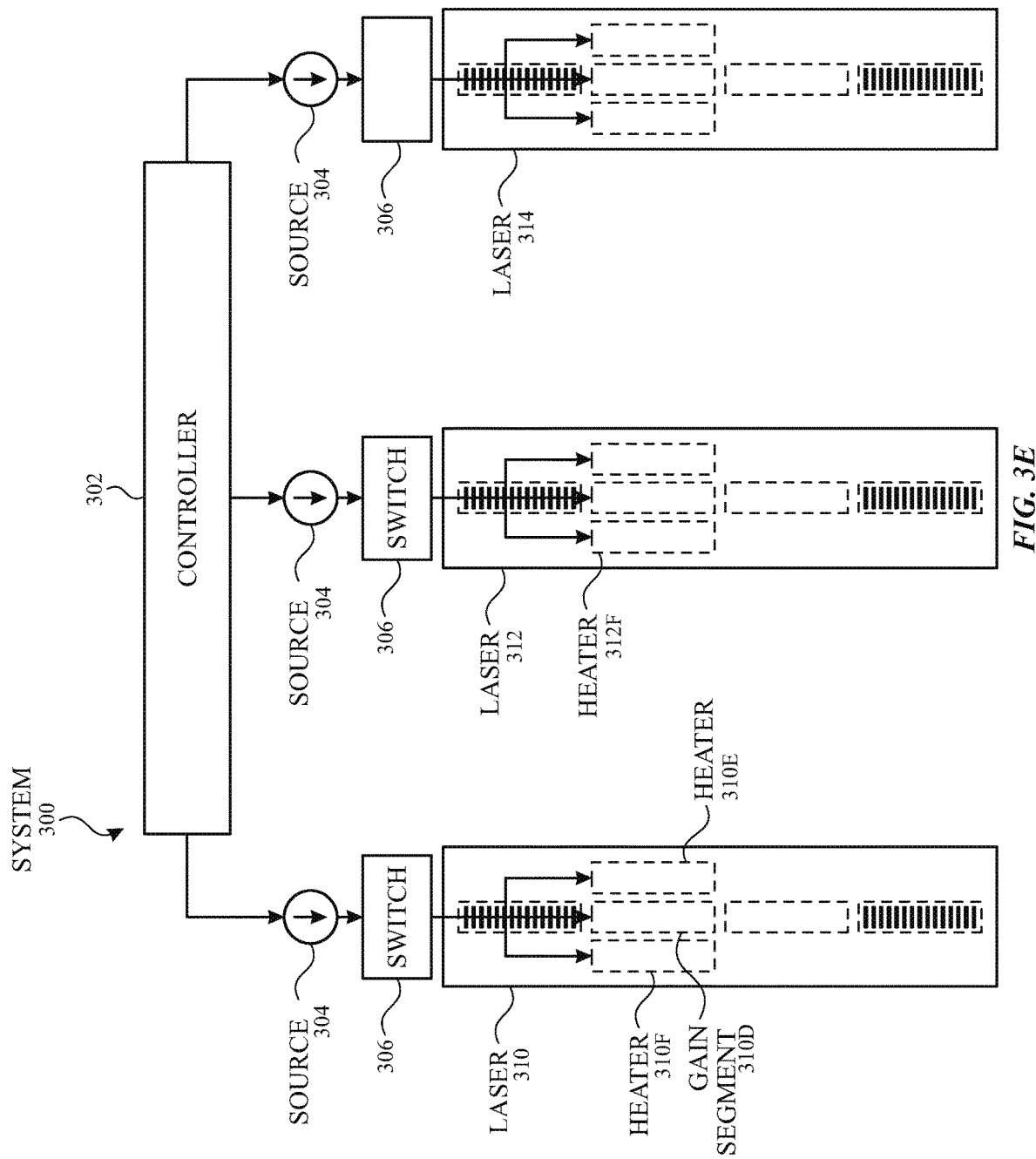
FIG. 3E illustrates a top view of an exemplary system including multiple lasers, each laser having heaters according to examples of the disclosure.

In some examples, the separation distances and distribution of current among the heaters can be based on the properties and/or activation modes of heaters in adjacent lasers. FIG. 3E illustrates a top view of an exemplary system including lasers having heaters according to examples of the disclosure. System 300 can include laser 310, laser 312, and laser 314. Each laser can be coupled to a circuitry 306 and a source 304. In some examples, all sources 304 can be coupled to controller 302. One or more sections of each laser can be coupled to a temperature control system (e.g., temperature control system 220 illustrated in FIG. 2A).

Laser 310 can have one adjacent laser (e.g., laser 312) located on the side closest to heater 310E. In some instances, heater 312F of laser 312 can be activated (i.e., a current can be applied to the heater). The separation distance between laser 310 and laser 312 can be such that the heat generated by heater 312F can be thermally coupled to laser 310. To compensate for this thermal cross-talk, circuitry 306 of laser 310 can route a higher percentage of current from source 304 to heater 310F to prevent or reduce uneven distribution of heat (e.g., in the area between heater 310E and heater 312F) and/or thermal crosstalk between laser 310 and laser 312.

In some examples, the system can be configured such that the separation distances between adjacent lasers (e.g., laser 310 and laser 312) can prevent or reduce thermal crosstalk. In some examples, the separation distance between a gain segment (e.g., gain segment 310D) and heater (e.g., heater 310E) with a given laser (e.g., laser 310) can be less (e.g., 5 times less, 10 times less, etc.) than the separation distance between heaters (e.g., heater 310E and heater 312F) in adjacent lasers. For example, the separation distance between gain segment 310D and heater 310E can be 10 μm, while the separation distance between heater 310E and heater 312F can be 100 μm.

Figure 4A:
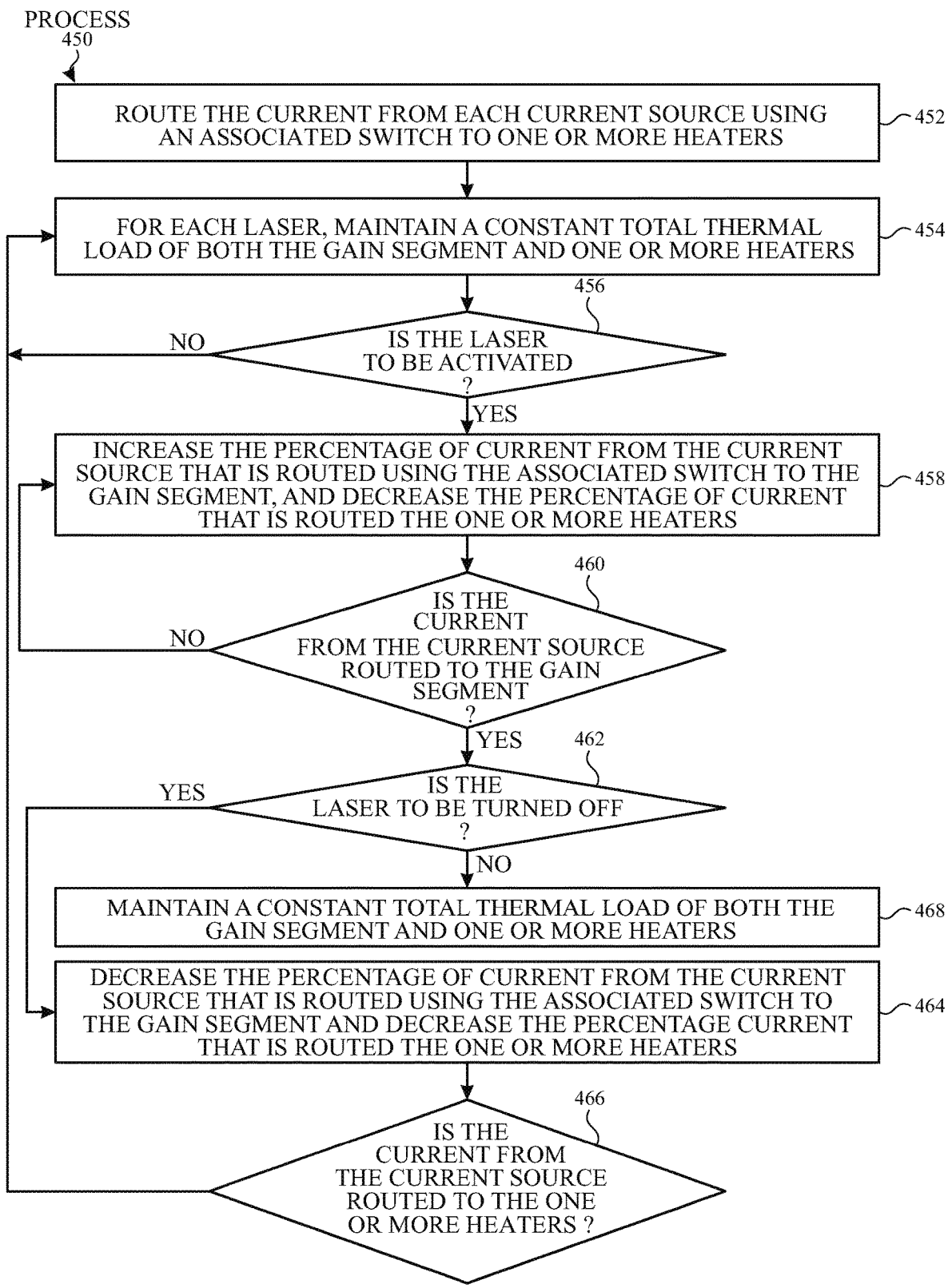
FIG. 4A illustrates an exemplary method for operating the heaters and gain segments in the plurality of lasers for multi-wavelengths emissions according to examples of the disclosure.

FIG. 4A illustrates an exemplary method for operating the heaters and gain segments in the plurality of lasers included in a system configured for multi-wavelengths emissions according to examples of the disclosure. The process can begin with each laser source turned off. The lasers can be heated by routing a certain amount (including, but not limited to, 100%) of the current from each current source (e.g., current source 304 illustrated in FIG. 3D) using an associated switch (e.g., circuitry 306 illustrated in FIG. 3D) to one or more heaters (e.g., heater 312F illustrated in FIG. 3D) (step 452 of process 450). Alternatively, each laser can be coupled to a separate current source, and the controller can configure each current source. For each laser (e.g., laser 310, laser 312, and laser 314 illustrated in FIG. 3D), a total thermal load of the gain segment (e.g., gain segment 312D illustrated in FIG. 3B) and one or more heaters can be maintained (e.g., by controller 320 illustrated in FIG. 3D) (step 454 of process 450). When the laser is to be activated (step 456 of process 450), the percentage of current (e.g., from the current source that is routed using the associated switch) to the gain segment can increase, and the percentage of current that is routed to the one or more heaters can decrease (step 458 of process 450). In this manner, the current injected into the laser can increase to turn on the laser and/or increase the intensity of emitted light. At the same time, the amount and/or percentage of current to the heater(s) can decrease to compensate for the increase in temperature in the gain segment (e.g., due to the increased injection currents). The increase in current to the gain segment and the decrease in current to the heaters can be such that the total thermal load of both the gain segment and heaters can be within a pre-determined range from a target value. The increase in current to the gain segment can continue until some or all of the current from the current source can be routed to the gain segment (step 460 or process 450). In some examples, the temperature changes (and/or applied current) to the gain segment can be incrementally increased (e.g., by increasing the injection current), and the temperature changes (and/or applied current) to the one or more heaters can be incrementally decreased.

While the laser is operating in the emission operation mode, the temperature control system can be configured to maintain the total thermal load (step 468 of process 450). When the laser is to be turned off (step 462 of process 450), the amount and/or percentage of current (e.g., from the current source that can be routed using the associated switch) to the gain segment can be decreased, and the amount and/or percentage of current that can be routed to the one or more heaters can increase (step 464 of process 450). In this manner, the current injection into the laser can decrease to turn off the laser or decrease the intensity of emitted light. The decrease in current to the gain segment and the increase in current to the heaters can be such that the total thermal load of both the gain segment and heaters can be within a range from a pre-determined target value. The decrease in current to the gain segment can continue until some or all of the current from the current source can be routed to the heater(s) (step 466 or process 450). In some examples, the temperature changes (and/or applied current) to the gain segment can be incrementally decreased (e.g., by decreasing the injection current), and the temperature changes (and/or applied current) to the one or more heaters can be incrementally increased.

Examples of the disclosure can include applying the steps of process 450 to only those lasers to be activated. Heaters can be heated in a given time period prior to when the associated laser can be activated (e.g., in the next time period). For example, steps 452-456 can be executed during the given time period (when the soon-to-be activated laser can be off), and steps 458-466 can be executed during the next time period (when the laser is operating in the subthreshold or emission operation mode). All other lasers can remain off (e.g., to conserve power) during the given time period and next time period.

Figure 4B:
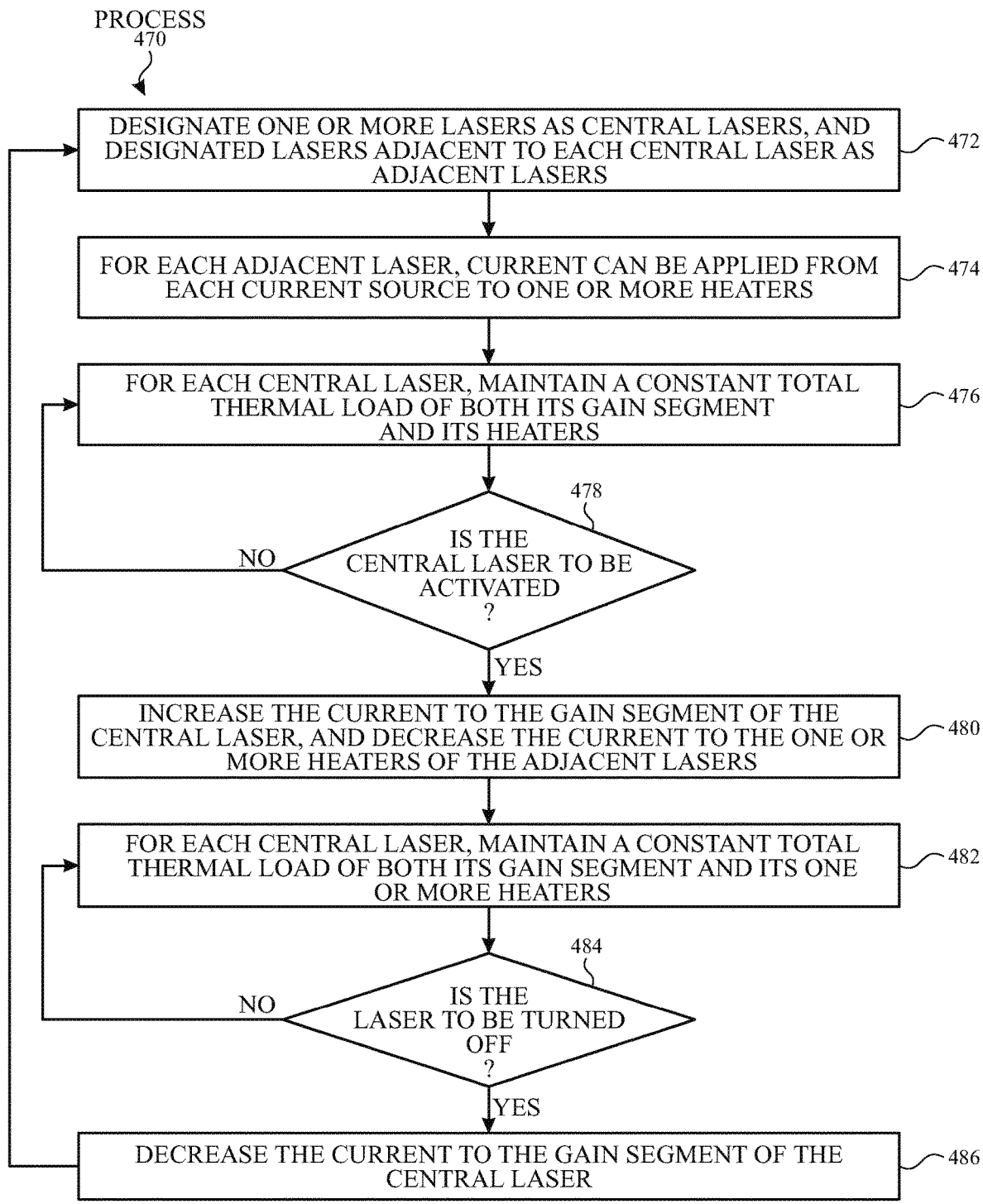
FIG. 4B illustrates an exemplary method for operating selectively activated heaters according to examples of the disclosure.

In some examples, heaters in one or more lasers adjacent to a central laser can be selectively activated to assist in heating the central laser. FIG. 4B illustrates an exemplary method for operating selectively activated heaters according to examples of the disclosure. The process can begin with each laser source turned off. In a given time period, one or more lasers can be selected as central lasers, which can be lasers that are to be activated in the next time period (step 472 of process 470). For example, laser 312 (illustrated in FIG. 3D) can be designated as a central laser, while laser 310 and laser 314 can be designated as adjacent lasers (i.e., lasers adjacent to the central laser). All other lasers can remain off for the given time period and next time period.

For each adjacent laser, current can be applied from each current source to one or more heaters (step 474 of process 470). In some examples, the current applied to the one or more heaters can be based on the target total thermal load to be maintained for a given central laser. For example, the target total thermal load can be equal to the thermal load of the central laser when operating with its predetermined final injection current and optionally can account for any heat loss due to heating via thermal cross-talk. For each central laser, the target total thermal load of both its gain segment and its heater(s) can be maintained (step 476 of process 470). Optionally, the heater(s) of the central laser can be used in addition to the heater(s) of adjacent lasers to achieve total thermal load of the central laser that is within a range of a predetermined target value.

When the central laser is activated (step 478 of process 470), the current to the gain segment of the central laser can be increased (step 480 of process 470). The increase in current to the gain segment can lead to an increase in temperature of the gain segment. To compensate for this increase in temperature, the current to the heaters of the adjacent lasers can be decreased (step 480 of process 470). Optionally, the heater(s) of the central laser can be decreased. For each central laser, the total thermal load of both its gain segment and its heater(s) can be maintained (step 482 of process 470) until the laser is to be turned off (step 484 of process 470). The current in the gain segment of the central laser can be decreased (step 486 of process 470). In some examples, the current(s) to the heater(s) can drop to zero after the central laser is no longer operating in the emission operation mode. Optionally, the current to the heater(s) of the adjacent laser(s) and/or central laser can be increased.

Figure 5A:
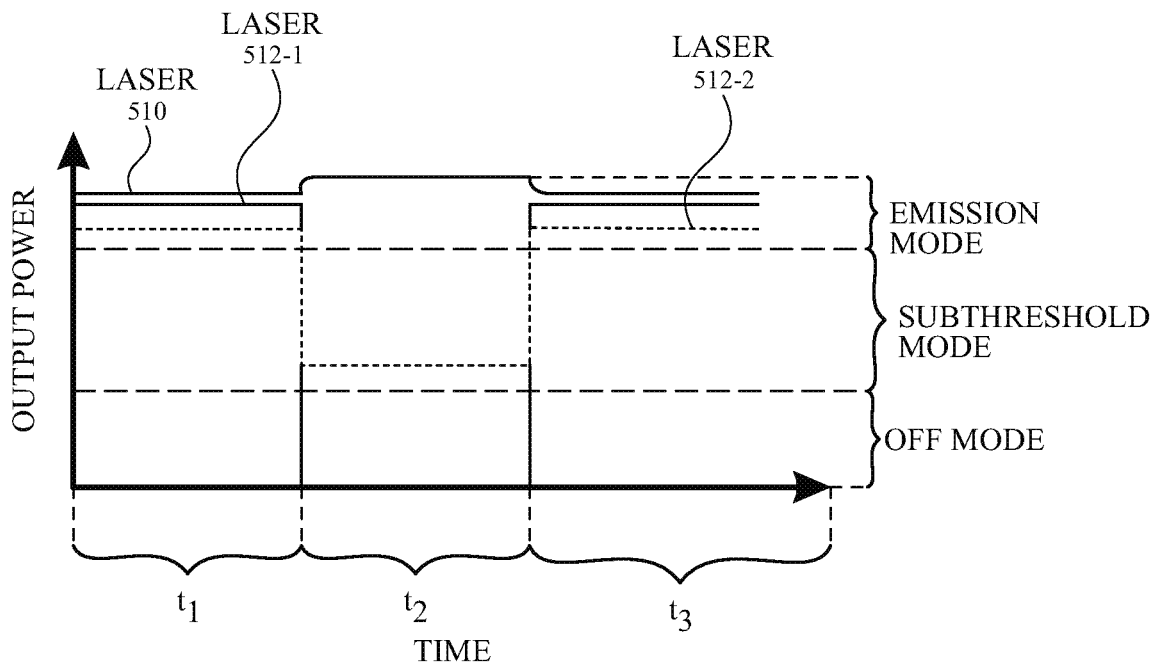
FIGS. 5A-5B illustrate exemplary plots of output power and emissions wavelengths of light emitted by two adjacent lasers during emission and subthreshold operation modes of a central laser according to examples of the disclosure.
Figure 5B:
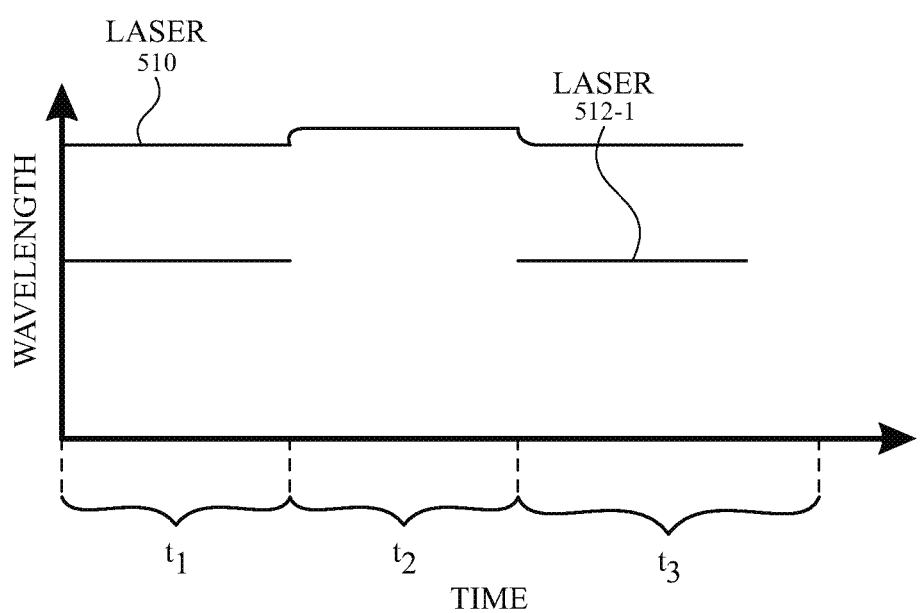

In some examples, one or more of the plurality of lasers can be operated in a subthreshold operation mode to reduce thermal transients and crosstalk. FIGS. 5A-5B illustrate exemplary plots of output power and emissions wavelength of light emitted by two adjacent lasers during the emission operation modes and subthreshold operation modes of the central laser according to examples of the disclosure. Adjacent lasers can include laser 510 and laser 512, which can be arranged such that the adjacent laser can experience thermal crosstalk from the central laser. The figure illustrates two light emission plots for laser 512: one plot for laser 512 operating in outside of a subthreshold operation mode (e.g., operating in the off operation mode), indicated as laser 512-1; and another plot for laser 512 operating in a subthreshold operation mode, indicated as laser 512-2.

During time $t_1$, the adjacent lasers can be activated (i.e., the current injected in each laser can be greater than or equal to the laser's threshold current such that the laser can be emitting light, as illustrated in FIG. 2C). During time $t_2$, the controller can be configured to prevent or reduce laser 512 from emitting light. To prevent or reduce laser 512 from emitting light, the current injected into laser 512-2 can be reduced to below the laser threshold current. In some examples, laser 512-2 can be configured to operate in a subthreshold operation mode, where the current injected into laser 512-2 can be below the laser threshold current and between the normal operating current (e.g., when the laser can be emitting light) and zero current. In some examples, the subthreshold operation mode can include an injection current that can be between 10-50% of normal operating current.

Due to the change in injection current to laser 512-2, the output power of laser 510 can change, as illustrated in FIG. 5A. The output power of laser 510 can increase (after a small time, equal to the thermal time-constant of the relevant portion of the semiconductor material, to reach steady-mode) due to the reduced heating of laser 512-2 when laser 512-2 is operating in the subthreshold operation mode. Additionally, as illustrated in FIG. 5B, laser 510 can experience a shift in wavelength when laser 512-2 switches to operating in the subthreshold operation mode. The shift in wavelength can be a shift towards either shorter or longer wavelengths depending on the design of the laser cavity. Although there can be some increase in output power and shift in wavelength of laser 510, the increase and shift can be reduced compared to laser 512-1, which can experience a more significant drop in temperature due to the injection current dropping to zero. By operating laser 512-2 in subthreshold operation mode, the thermal perturbation to laser 510 can be reduced (e.g., cut in half if the subthreshold operation mode for laser 512 includes 50% of normal operating current). In some examples, the temperature control system and/or controller can anticipate laser 512 switching to subthreshold operation mode and can, in advance, adjust the temperature of the adjacent laser 510 to compensate (e.g., slightly decrease the temperature through the heater(s) to reduce the impact).

A semiconductor laser is disclosed. The semiconductor laser can comprise: one or more reflective sections, where at least one reflective section is configured to at least partially reflect light back into a cavity of the laser; an optical gain region configured to amplify light energy; and one or more heaters configured to generate heat in response to a non-zero current, wherein each heater is optically decoupled and thermally coupled to the optical gain region. Additionally or alternatively, in some examples, the one or more heaters have the same electrical properties as the optical gain region. Additionally or alternatively, in some examples, the one or more heaters include at least two heaters, and a separation distance from each heater to the optical gain region is the same. Additionally or alternatively, in some examples, the one or more heaters include a first heater and a second heater, and a separation distance from the first heater to the optical gain region is different from a separation distance from the second heater to the optical gain region. Additionally or alternatively, in some examples, the one or more heaters include a serpentine metal.

A method of controlling a semiconductor laser is disclosed. The method can comprise: operating the semiconductor laser in one of a plurality of operation modes, the plurality of operation modes including an off operation mode, a subthreshold operation mode, and an emission operation mode, wherein the laser is configured to emit light in the emission operation mode; coupling an optical gain region included in the semiconductor laser to a first temperature sensor, the first temperature sensor measuring a first temperature of the optical gain region; optically decoupling and thermally coupling one or more heaters included in the semiconductor laser to the optical gain region; coupling the one or more heaters to one or more second temperature sensors, the one or more second temperature sensors measuring one or more second temperatures of the one or more heaters; and maintaining a total thermal load for all of the plurality of operation modes, wherein the total thermal load is equal to a first thermal load, associated with the first temperature, and the one or more second thermal loads, associated with the one or more second temperatures. Additionally or alternatively, in some examples, the method further comprises: dynamically configuring a switching operation of a switch, the switching operation including one or more of: coupling a source to the optical gain region, and coupling the source to the one or more heaters. Additionally or alternatively, in some examples, the method further comprises: configuring a junction to divide a current, from a source, between at least the one or more heaters. Additionally or alternatively, in some examples, the operation of the semiconductor laser includes increasing an injection current to transition the semiconductor laser from the off operation mode to the emission operation mode, the method further comprising: decreasing a current applied to the one or more heaters concurrent with increasing of the injection current. Additionally or alternatively, in some examples, the injection current is incrementally increased, and the current is incrementally decreased. Additionally or alternatively, in some examples, the operation of the semiconductor laser includes decreasing an injection current to transition the semiconductor laser from the emission operation mode to the subthreshold operation mode or the off operation mode, the method further comprising: increasing a current applied to the one or more heaters concurrent with the decreasing of the injection current. Additionally or alternatively, in some examples, the injection current is incrementally decreased, and the current is incrementally increased. Additionally or alternatively, in some examples, the method further comprises: when the laser is not lasing, operating the laser in the subthreshold operation mode. Additionally or alternatively, in some examples, operating the laser in the subthreshold operation mode includes driving the laser with a first current and operating the laser in the emission operation mode includes driving the laser with a second current, the first current being 10-50% of the second current. Additionally or alternatively, in some examples, the method further comprises: dividing a coupling between each of the one or more heaters and a source, the coupling based on a relative separation distance of the one or more heaters from the optical gain region.

A system is disclosed. The system can comprise: a plurality of integrated semiconductor lasers, at least some of the plurality of integrated semiconductor lasers configured to emit one or more different wavelengths of light; and a first laser included in the plurality of integrated semiconductor lasers, the first laser including: one or more reflective sections, wherein at least one reflective section is configured to at least partially reflect light back into a cavity of the laser, an optical gain region configured to amplify light energy, and one or more heaters configured to generate heat in response to a non-zero current, wherein each heater is optically decoupled and thermally coupled to the optical gain region. Additionally or alternatively, in some examples, the system further comprises: a second laser included in the plurality of integrated semiconductor lasers, wherein the second laser is adjacent to and thermally decoupled from the first laser. Additionally or alternatively, in some examples, a first separation distance between the first laser and the second laser is greater than a second separation distance between one of the one or more heaters and the optical gain region of the first laser, the first separation distance is at least 100 μm, and the second separation distance is at least 10 μm. Additionally or alternatively, in some examples, the plurality of integrated semiconductor lasers includes outer lasers and inner lasers, located between the outer lasers, each of the outer lasers includes two heaters, and at least one of the outer lasers includes one heater. Additionally or alternatively, in some examples, the system further comprises: one or more sources coupled to the plurality of integrated semiconductor lasers, each source configured to supply a current; a plurality of switches, each switch coupled to one of the plurality of integrated semiconductor lasers and at least one of the one or more current sources, and configured to dynamically couple the at least one of the one or more sources to one or more of an optical gain region and one or more heaters in the at least one of the plurality of integrated semiconductor lasers. Additionally or alternatively, in some examples, the system further comprises: a substrate including: the one or more reflective sections of each integrated semiconductor laser, the optical gain region of each integrated semiconductor laser, and the one or more heaters of each integrated semiconductor laser. Additionally or alternatively, in some examples, the system further comprises: a first substrate including: the one or more reflective sections of each integrated semiconductor laser; and a second substrate including: the optical gain region of each integrated semiconductor laser, and the one or more heaters of each integrated semiconductor laser. Additionally or alternatively, in some examples, the first substrate is a silicon substrate, and the second substrate is a III-V substrate.

Although examples have been fully described with reference to the accompanying drawings, it is to be noted that various changes and modifications will become apparent to those skilled in the art. Such changes and modifications are to be understood as being included within the scope of the various examples as defined by the appended claims.

The invention claimed is:

1. A system comprising:
a plurality of semiconductor lasers configured to emit one or more different wavelengths of light and comprising:
a first laser; and
a second laser adjacent the first laser with no intervening laser positioned therebetween; wherein the first laser and the second laser each comprise:
one or more reflective sections configured to at least partially reflect light back into a respective laser cavity; and
an optical gain region configured to amplify light energy; and
one or more heaters configured to generate heat in response to a non-zero current; wherein:
a first heater of the one or more heaters positioned between the first laser and the second laser,
the first heater is optically decoupled from the optical gain region of the first laser and thermally coupled to the optical gain region of the first laser;
at a given time, the first laser is configured to operate in an emission mode concurrent with the second laser operating in a subthreshold mode to maintain a controlled thermal output from the second laser to the first laser; and
the first heater is closer to the first laser than the second laser.

2. The system of claim 1, wherein the second laser is thermally coupled to the first laser.

3. The system of claim 2, wherein a first separation distance between the first laser and the second laser is greater than a second separation distance between the first heater and the optical gain region of the first laser,
the first separation distance is at least 100 µm, and
the second separation distance is at least 10 µm.

4. The system of claim 1, wherein the plurality of semiconductor lasers includes outer lasers and inner lasers, the inner lasers located between the outer lasers, each of the outer lasers includes two heaters, and at least one of the inner lasers includes one heater.

5. The system of claim 1, further comprising:
one or more sources coupled to the plurality of semiconductor lasers, each source configured to supply a current; and
a plurality of switches, each switch coupled to one of the plurality of semiconductor lasers and at least one of the one or more current sources, and configured to dynamically couple the at least one of the one or more sources to the optical gain region, the one or more heaters, or both in the at least one of the plurality of semiconductor lasers.

6. The system of claim 1, further comprising:
a substrate including:
the one or more reflective sections of each of the first laser and the second laser,
the optical gain region of each of the first laser and the second laser, and
the one or more heaters.

7. The system of claim 1, further comprising:
a first substrate including:
the one or more reflective sections of each of the first laser and the second laser; and
a second substrate including:
the optical gain region of each of the first laser and the second laser, and
the one or more heaters, wherein the first substrate is a silicon substrate, and the second substrate is a III-V substrate.

8. A method of controlling a first semiconductor laser and a second semiconductor laser, the method comprising:
at a first time:
operating the first semiconductor laser in an emission operation mode, wherein the first semiconductor laser is configured to emit light in the emission operation mode;
operating the second semiconductor laser in a subthreshold operation mode to maintain a controlled thermal output from the second semiconductor laser to the first semiconductor laser;
coupling a first optical gain region included in the first semiconductor laser to a first temperature sensor, the first temperature sensor measuring a first temperature of the first optical gain region;
optically decoupling and thermally coupling one or more heaters to the first optical gain region; and
coupling the one or more heaters to one or more second temperature sensors, the one or more second temperature sensors measuring one or more second temperatures of the one or more heaters; and
maintaining a total thermal load for a plurality of operation modes, the plurality of operation modes including an off operation mode, the subthreshold operation mode, and the emission operation mode, wherein:
the second semiconductor laser is configured to receive an injection current and not emit light in the subthreshold operation mode;
the first semiconductor laser adjacent the second semiconductor laser with no intervening semiconductor laser positioned therebetween;
a first heater of the one or more heaters is between the first semiconductor laser and the second semiconductor laser; and
the first heater is closer to the first semiconductor laser than the second semiconductor laser;
the total thermal load is equal to a first thermal load and one or more second thermal loads;
the first thermal load is associated with the first temperature; and
the one or more second thermal loads are associated with the one or more second temperatures.

9. The method of claim 8, further comprising:
at a second time, operating the first semiconductor laser in the off mode;
at a third time:
increasing an injection current to the first semiconductor laser to transition the first semiconductor laser from the off operation mode to the emission operation mode;
decreasing a current applied to the one or more heaters concurrent with the increase of the injection current to the first semiconductor laser.

10. The method of claim 9, wherein the increase of the injection current to the first semiconductor laser is an incremental increase, and the decrease of the current applied to the one or more heaters is an incremental decrease.

11. The method of claim 8, further comprising:
at a second time:
decreasing an injection current to the first semiconductor laser to transition the first semiconductor laser from the emission operation mode to the subthreshold operation mode or the off operation mode;
increasing a current applied to the one or more heaters concurrent with the decrease of the injection current to the first semiconductor laser.

12. The method of claim 11, wherein the decrease of the injection current to the first semiconductor laser is an incremental decrease, and the increase of the current applied to the one or more heaters is an incremental increase.

13. The method of claim 8, wherein the subthreshold operation mode includes driving the respective semiconductor laser with a first injection current, and
wherein the emission operation mode includes driving the respective semiconductor laser with a second injection current, the first injection current being 10-50% of the second injection current.

14. The method of claim 8, further comprising:
dividing a coupling between each of the one or more heaters and a source, the coupling based on a relative separation distance of the one or more heaters from the first optical gain region.

15. A semiconductor laser system comprising:
a first semiconductor laser comprising:
one or more reflective sections;
an optical gain region configured to amplify light energy; and
a first set of heaters configured to generate heat in response to a non-zero current; wherein:
the first set of heaters is optically decoupled from the optical gain region and thermally coupled to the optical gain region;
the optical gain region has the same material properties as the first set of heaters;
the first semiconductor laser is thermally coupled to the first set of heaters; and a second set of heaters is thermally coupled to a second semiconductor laser;
the first semiconductor laser adjacent the second semiconductor laser with no intervening semiconductor laser positioned therebetween;
a first heater of the first set of heaters is between the first semiconductor laser and the second semiconductor laser;
the first heater is closer to the first semiconductor laser than the second semiconductor laser; and
at a given time, the first laser is configured to operate in an emission mode concurrent with the second laser operating in a subthreshold mode to maintain a controlled thermal output from the second laser to the first laser.

16. The first semiconductor laser of claim 15, wherein the first set of heaters has the same electrical properties as the optical gain region.

17. The first semiconductor laser of claim 15, wherein the first set of heaters includes at least two heaters, and a separation distance from each heater to the optical gain region is the same.

18. The first semiconductor laser of claim 15, wherein the second set of heaters comprises:
a second-heater; and
a third heater, the second and third heaters are different than the first set of heaters; and
a separation distance from the second heater to the optical gain region is different from a separation distance from the third heater to the optical gain region.

* * * * *